United States Patent
Raj et al.

(10) Patent No.: US 10,005,025 B2
(45) Date of Patent: Jun. 26, 2018

(54) CORROSION RESISTANT ABATEMENT SYSTEM

(71) Applicant: Applied Materials, Inc., Santa Clara, CA (US)

(72) Inventors: Govinda Raj, Bangalore (IN); Monika Agarwal, Fremont, CA (US); Hamid Mohiuddin, Campbell, CA (US); Kadthala R. Narendrnath, San Jose, CA (US)

(73) Assignee: Applied Materials, Inc, Santa Clara, CA (US)

( * ) Notice: Subject to any disclaimer, the term of this patent is extended or adjusted under 35 U.S.C. 154(b) by 245 days.

(21) Appl. No.: 14/877,753

(22) Filed: Oct. 7, 2015

(65) Prior Publication Data
US 2016/0107117 A1 Apr. 21, 2016

Related U.S. Application Data

(60) Provisional application No. 62/120,349, filed on Feb. 24, 2015, provisional application No. 62/064,461, filed on Oct. 15, 2014.

(51) Int. Cl.
*B01D 53/32* (2006.01)
*B01D 53/68* (2006.01)
*H01J 37/32* (2006.01)

(52) U.S. Cl.
CPC ............ *B01D 53/32* (2013.01); *H01J 37/321* (2013.01); *H01J 37/3244* (2013.01); *H01J 37/32082* (2013.01); *H01J 37/32477* (2013.01); *H01J 37/32844* (2013.01); *B01D 53/68* (2013.01); *B01D 2257/2025* (2013.01); *B01D 2257/2027* (2013.01); *B01D 2257/2045* (2013.01); *B01D 2257/2047* (2013.01);
(Continued)

(58) Field of Classification Search
None
See application file for complete search history.

(56) References Cited

U.S. PATENT DOCUMENTS 6,391,146 B1 5/2002 Bhatnagar et al.
6,517,913 B1 2/2003 Cheung et al.
(Continued)

FOREIGN PATENT DOCUMENTS

KR 10-2013-0114607 A 10/2013

OTHER PUBLICATIONS

PCT Notification of Transmittal of the International Search Report and the Written Opinion of the International Searching Authority for International Application No. PCT/US2015/050184; dated Jan. 29, 2016; 12 total pages.

*Primary Examiner* — Kishor Mayekar
(74) *Attorney, Agent, or Firm* — Patterson + Sheridan, LLP (57) ABSTRACT

Embodiments disclosed herein include a plasma source, and an abatement system for abating compounds produced in semiconductor processes. In one embodiment, a plasma source is disclosed. The plasma source includes a body having an inlet and an outlet, and the inlet and the outlet are fluidly coupled within the body. The body further includes inside surfaces, and the inside surfaces are coated with yttrium oxide or diamond-like carbon. The plasma source further includes a flow splitter disposed in the body in a position that formed two flow paths between the inlet and the outlet, and a plasma generator disposed in a position operable to form a plasma within the body between the flow splitter and inside surfaces of the body.

10 Claims, 7 Drawing Sheets

(52) U.S. Cl.
CPC ............... *B01D 2258/0216* (2013.01); *B01D 2259/818* (2013.01); *Y02C 20/30* (2013.01)

(56) References Cited

U.S. PATENT DOCUMENTS

| | | |
|---|---|---|
| 7,833,401 B2 | 11/2010 | Han et al. |
| 2011/0089017 A1 | 4/2011 | Hur et al. |
| 2014/0262033 A1 | 9/2014 | Herbert et al. |

Fig. 4D

CORROSION RESISTANT ABATEMENT SYSTEM

CROSS-REFERENCE TO RELATED APPLICATIONS

This application claims priority to U.S. Provisional Patent Application Ser. No. 62/064,461, filed on Oct. 15, 2014 and U.S. Provisional Patent Application Ser. No. 62/120,349, filed on Feb. 24, 2015, which herein are incorporated by reference.

BACKGROUND

Field

Embodiments of the present disclosure generally relate to semiconductor processing equipment. More particularly, embodiments of the present disclosure relate to a plasma source, and an abatement system for abating compounds produced in semiconductor processes.

Description of the Related Art

The process gases used by semiconductor processing facilities include many compounds which must be abated or treated before disposal, due to regulatory requirements and environmental and safety concerns. Typically, an abatement system may be coupled to a processing chamber to abate the compounds exiting the processing chamber. The abatement system typically includes at least a plasma source. Halogen-containing plasma and gases are frequently used in etch or cleaning processes, and components of the processing chamber and the abatement system are susceptible to corrosion from the halogen-containing plasma and gases. The corrosion reduces the service life of the processing chamber components and the abatement system, and, additionally, introduces undesirable defects and contamination into the processing environment.

Accordingly, what is needed in the art is an improved plasma source, and an abatement system for abating compounds produced in semiconductor processes.

SUMMARY

Embodiments disclosed herein include a plasma source, and an abatement system for abating compounds produced in semiconductor processes. In one embodiment, a plasma source is disclosed. The plasma source includes a body having an inlet and an outlet, and the inlet and the outlet are fluidly coupled within the body. The body further includes inside surfaces, and the inside surfaces are coated with yttrium oxide or diamond-like carbon. The plasma source further includes a flow splitter disposed in the body in a position that formed two flow paths between the inlet and the outlet, and a plasma generator disposed in a position operable to form a plasma within the body between the flow splitter and inside surfaces of the body.

In another embodiment, an abatement system includes a foreline, and an inside surface of the foreline is coated with yttrium oxide or diamond-like carbon. The abatement system further includes a plasma source coupled to the foreline, and the plasma source includes a body having an inlet fluidly coupled to an outlet. The body further includes inside surfaces, and the inside surfaces are coated with yttrium oxide or diamond-like carbon. The plasma source further includes a flow splitter disposed in the body in a position that formed two flow paths between the inlet and the outlet.

In another embodiment, a plasma source includes a body having an inlet and an outlet, an RF coil surrounding the body, and a channel formed in the body and fluidly coupling the inlet and the outlet. An inside surface of the channel is coated with yttrium oxide, diamond-like carbon, or aluminum oxide silicon magnesium yttrium.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein include a plasma source, and an abatement system for abating compounds produced in semiconductor processes. The compounds produced in semiconductor processes may be corrosive and may damage components of the abatement system, such as the plasma source. In order to prolong the service life of the abatement system, inside surfaces of components of the abatement system, such as inside surfaces of the plasma source, may be coated with yttrium oxide or diamond-like carbon, which are corrosion resistant. The plasma source may have a spherical body to increase the efficiency and diffusion of the coating process.

Figure 1:
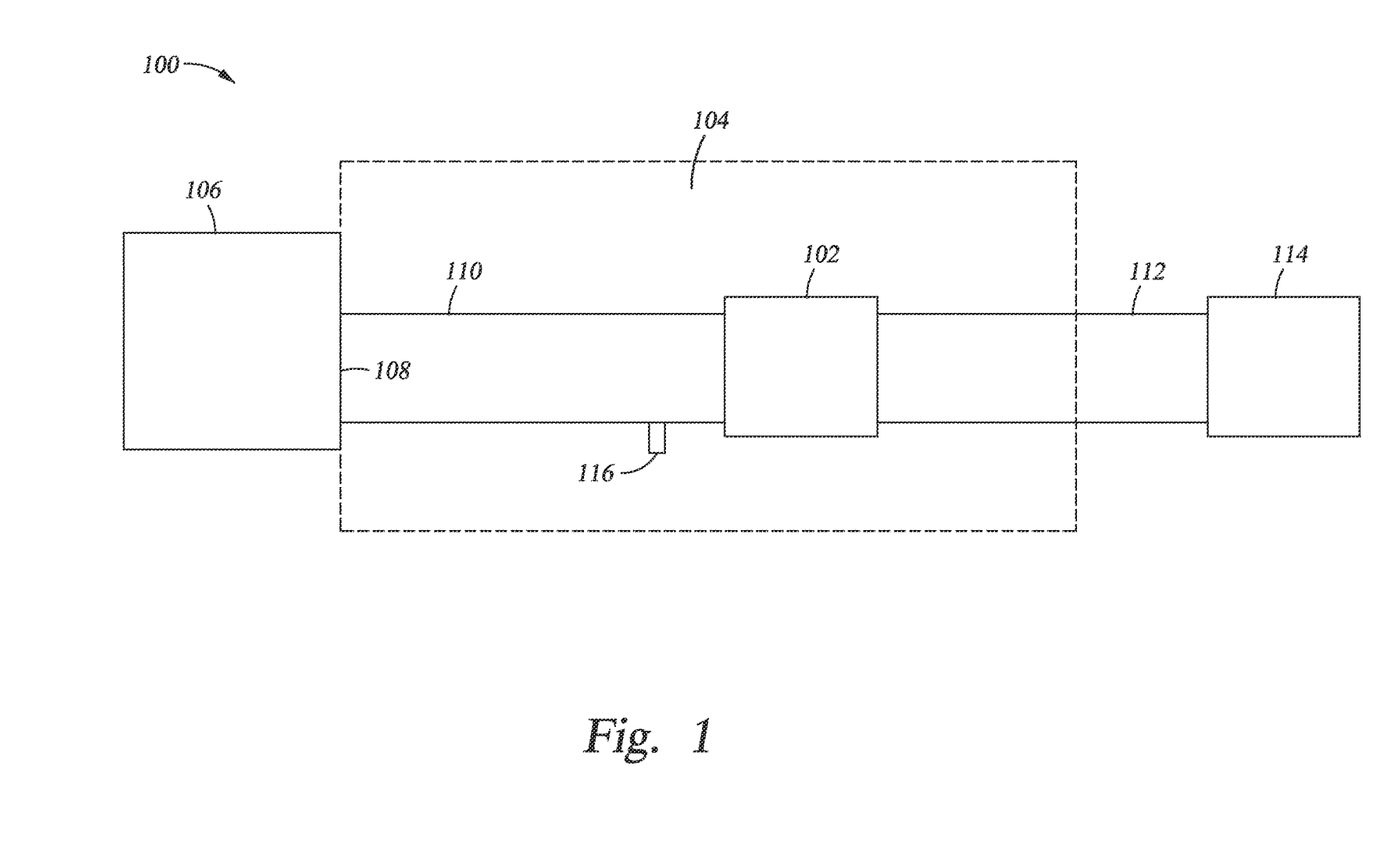
FIG. 1 is a schematic side view of a vacuum processing system having a plasma source.

FIG. 1 is a schematic side view of a vacuum processing system 100 having a plasma source 102 utilized in an abatement system 104. The abatement system 104 includes at least the plasma source 102. The vacuum processing system 100 includes a vacuum processing chamber 106 that is generally configured to perform at least one integrated circuit manufacturing process, such as a deposition process, an etch process, a plasma treatment process, a preclean process, an ion implant process, or other integrated circuit manufacturing process. The process performed in the vacuum processing chamber 106 may be plasma assisted. For example, the process performed in the vacuum processing chamber 106 may be plasma etch process.

The vacuum processing chamber 106 has a chamber exhaust port 108 coupled to the plasma source 102 of the abatement system 104 via a foreline 110. An exhaust of the plasma source 102 is coupled by an exhaust conduit 112 to pumps and facility exhaust, schematically indicated by a single reference numeral 114 in FIG. 1. The pumps are generally utilized to evacuate the vacuum processing chamber 106, while the facility exhaust generally includes scrubbers or other exhaust cleaning apparatus for preparing the effluent of the vacuum processing chamber 106 to enter the atmosphere.

The plasma source 102 is utilized to perform an abatement process on gases and/or other materials exiting the vacuum processing chamber 106 so that such gases and/or other materials may be converted into a more environmentally and/or process equipment friendly composition. The plasma source 102 may generate a capacitively coupled or inductively coupled plasma utilized in the abatement process. Details of the plasma source 102 are further described below.

In some embodiments, an injection port 116 is formed in the foreline 110 and/or the plasma source 102. The injection port 116 is configured to connect to an abating reagent source (not shown) to provide an abatement reagent into the plasma source 102 which may be energized to react with or otherwise assist converting the materials to be exiting the vacuum processing chamber 106 into a more environmentally and/or process equipment friendly composition.

Figure 2:
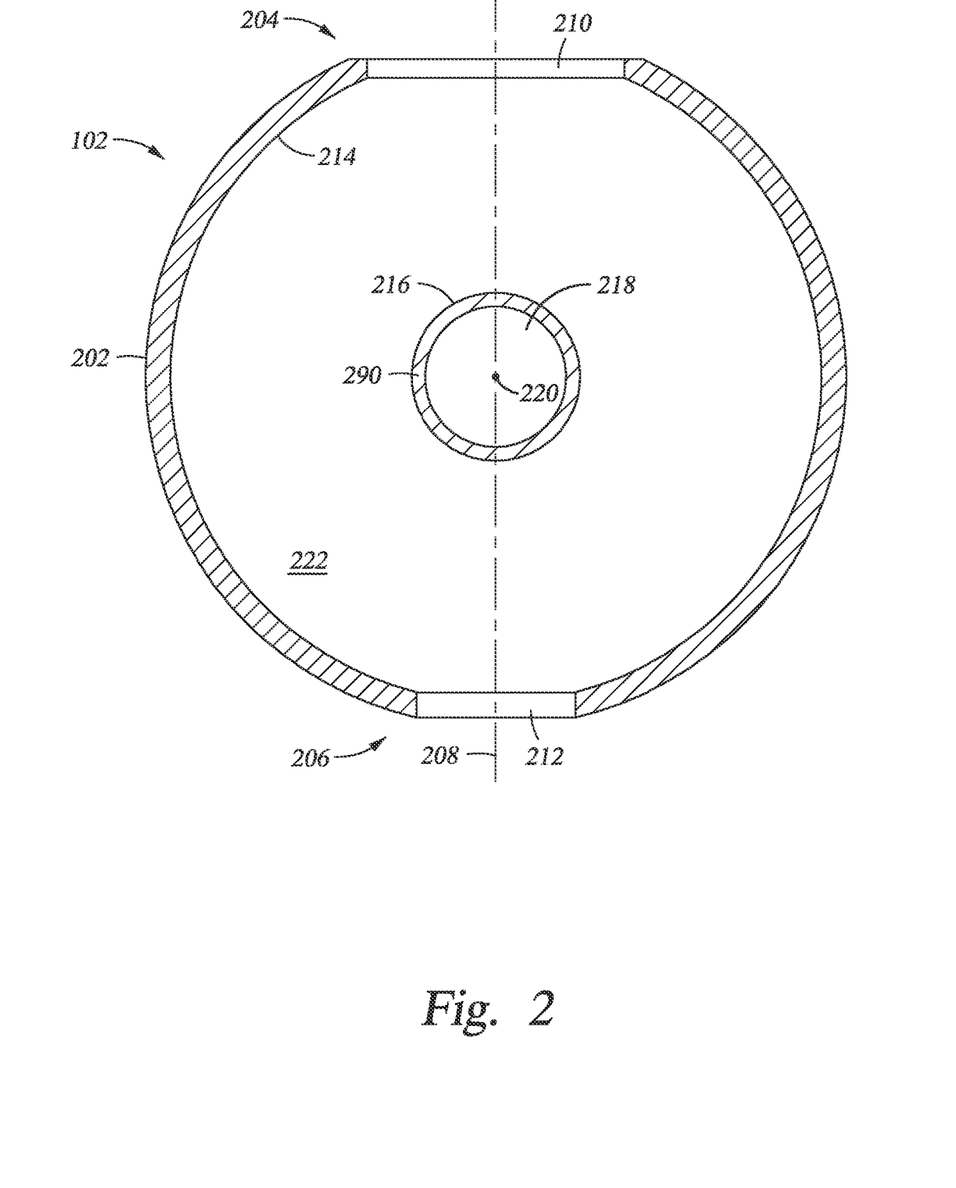
FIG. 2 is a sectional view of the plasma source of FIG. 1.

FIG. 2 is a sectional view of the plasma source 102. The plasma generated in the plasma source 102 energizes and/or dissociates, partially or fully, the compounds within the effluent coming out of the vacuum processing chamber 106, converting the compounds in the effluent into more benign form. In one embodiment, the plasma source 102 may act as a remote plasma source that is disposed upstream of the vacuum processing chamber 106 to deliver products of plasma, such as molecular or atomic species, into the vacuum processing chamber 106.

The plasma source 102 may include a body 202 having a first end 204 and a second end 206. An inlet 210 may be formed in the first end 204, and the inlet 210 may be configured to couple to the foreline 110. An outlet 212 may be formed in the second end 206, and the outlet 212 may be configured to couple to the exhaust conduit 112. The inlet 210 and the outlet 212 are fluidly coupled within the body 202, and may be aligned on an axis 208. The body 202 may be spherical (or have a spherical interior surface) in order to improve the efficiency of coating inside surfaces 214 of the spherical body 202 of the plasma source 102. However, the hollow body 202 may have a shape other than spherical. The body 202 may be made of quartz or aluminum oxide, which is susceptible to corrosion from materials, such as atomic or molecular halogen compounds, which may exit the vacuum processing chamber 106 and enter the plasma source 102. In order to protect the body 202 of the plasma source 102 from the corrosive materials and to increase the service life of the plasma source 102, the inside surfaces 214 of the body 202 may be coated with a coating material that is resistant to the corrosive materials. The coating material may be yttrium oxide, diamond-like carbon, or other suitable material. Other materials suitable for use as the coating material include materials that are resistance to corrosion when exposed to halogens. Diamond-like carbon is a class of amorphous carbon material that displays some of the typical properties of diamond. Diamond-like carbon includes significant amounts of $SP^3$ hybridized carbon atoms. The coating material may be coated on the inside surfaces 214, 216 by any suitable method, such as chemical vapor deposition (CVD) or arc spraying. In embodiments wherein the body 202 of the plasma source 102 is spherical, the efficiency and diffusion of the coating process, such as a CVD process, are improved. The inside surface of the foreline 110 may be also coated with the coating material, such as yttrium oxide and diamond-like carbon, to protect the foreline 110 from the corrosive materials exiting the vacuum processing chamber 106.

An opening 218 may be formed through the body 202. The opening 218 may be cylindrical and may have a longitudinal axis 220. The longitudinal axis 220 may be substantially perpendicular to the axis 208. A flow splitter 290 may be disposed through the opening 218 and extend into the interior volume of the body 202. Alternatively, the flow splitter 290 may be disposed in the interior volume of the body 202 without aid of an opening 218. A gas mixture, such as the corrosive materials in the effluent exiting the vacuum processing chamber 106 or in the example where the plasma source 102 is a remote plasma source, as precursor and/or carrier gases for generating a remote plasma, may enter the plasma source 102 through the inlet 210 at the first end 204. The surfaces 216 of the flow splitter 290, which are facing inside surfaces 214 of the body 202 and exposed to the gas mixture, may be coated identically as the inside surfaces 214 of the body 202. The gas mixture may be dissociated by a plasma formed in the plasma region 222 and treated by abating reagents, and exiting as a less hazardous material through the outlet 212 at the second end 206. The gas mixture may split into two flow paths within the body 202 by the flow splitter 290 extending through the opening 218, and then combine to a single stream when exiting the body 202 through the outlet 212. If the gas mixture is the corrosive materials in the effluent exiting the vacuum processing chamber 106, one or more abating reagents may be introduced into the plasma source 102 from the injection port 116 shown in FIG. 1. The corrosive materials in the effluent may include halogen containing materials, such as fluorine or chlorine containing materials.

Figure 3:
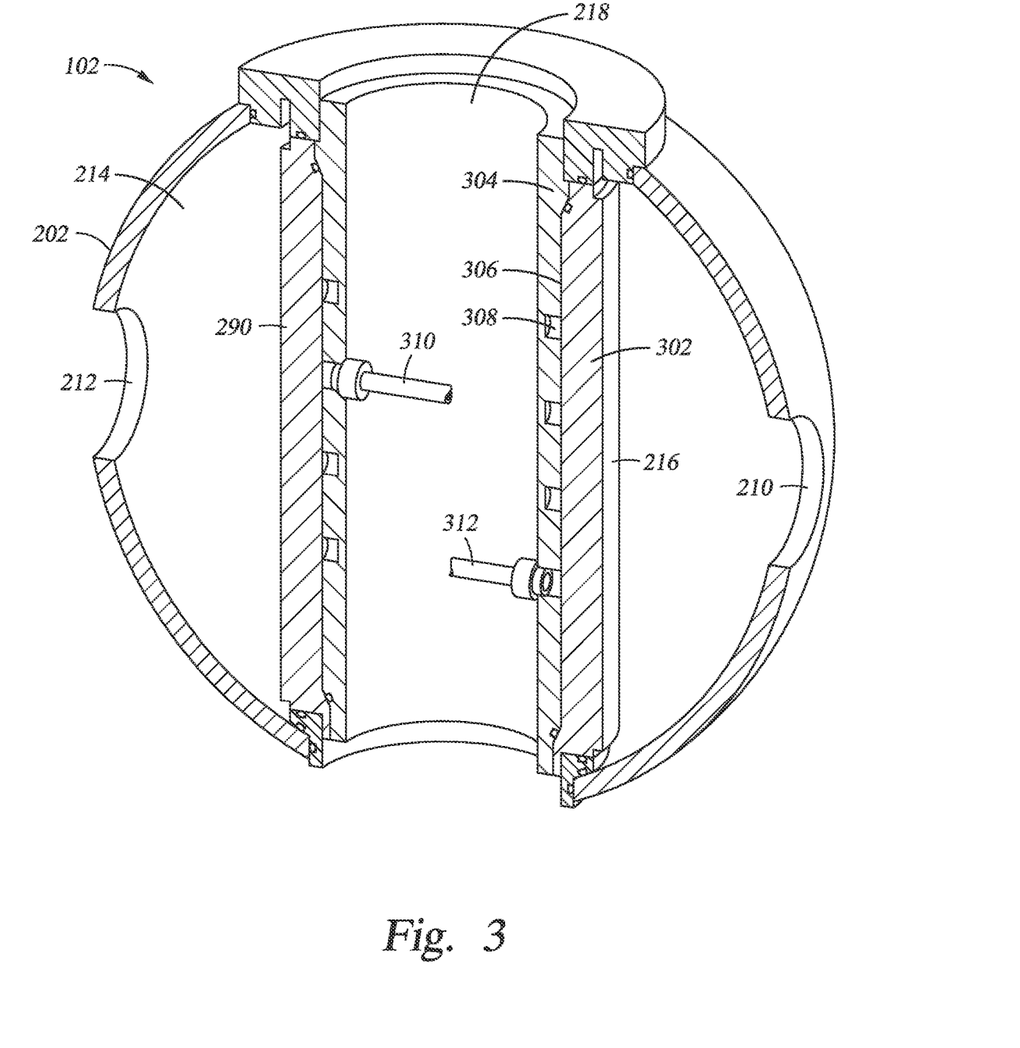
FIG. 3 is a cross sectional perspective view of the plasma source.

FIG. 3 is a cross sectional perspective view of the plasma source 102. As shown in FIG. 3, the body 202 may be spherical and may include the opening 218. A flow splitter 290 may be disposed in the opening 218. The flow splitter 290 may extend partially or completely across the body 202. The flow splitter 290 may be cylindrical, or have another geometric form. In one embodiment, the flow splitter 290 includes a plasma generator 302. In the embodiment of FIG. 3, the plasma generator 302 is an electrode. The electrode may be a hollow cylindrical electrode which may be coupled to an RF source (not shown) to energize the plasma generator 302. The body 202 may be grounded while RF power applied to the plasma generator 302. The plasma generator 302 is disposed in a position operable to form a plasma within the body 202 between the flow splitter 290 and inside surfaces 214 of the body 202 from the process gases disposed in the body 202 to form a plasma, thus making the plasma source 102 a capacitively coupled plasma source. Alternatively, one or more plasma generators (shown as coils 402 in FIGS. 4A-4D) may surround the body 202, and as such, RF power inductively coupled from the one or more plasma generators to the process gases disposed in the body 202 to form a plasma, thus making the plasma source 102 an inductively coupled plasma source.

In order to keep the plasma generator 302 cool during operation, a cooling jacket 304 may be coupled to the plasma generator 302. The plasma generator 302 may have an outside surface 306 opposite the inside surface 216. The cooling jacket 304 may be coupled to the outside surface 306. The cooling jacket 304 may have a cooling channel 308 formed therein, and the cooling channel 308 is coupled to a coolant inlet 310 and a coolant outlet 312 for flowing a coolant, such as water, into and out of the cooling jacket 304.

Figure 4A:
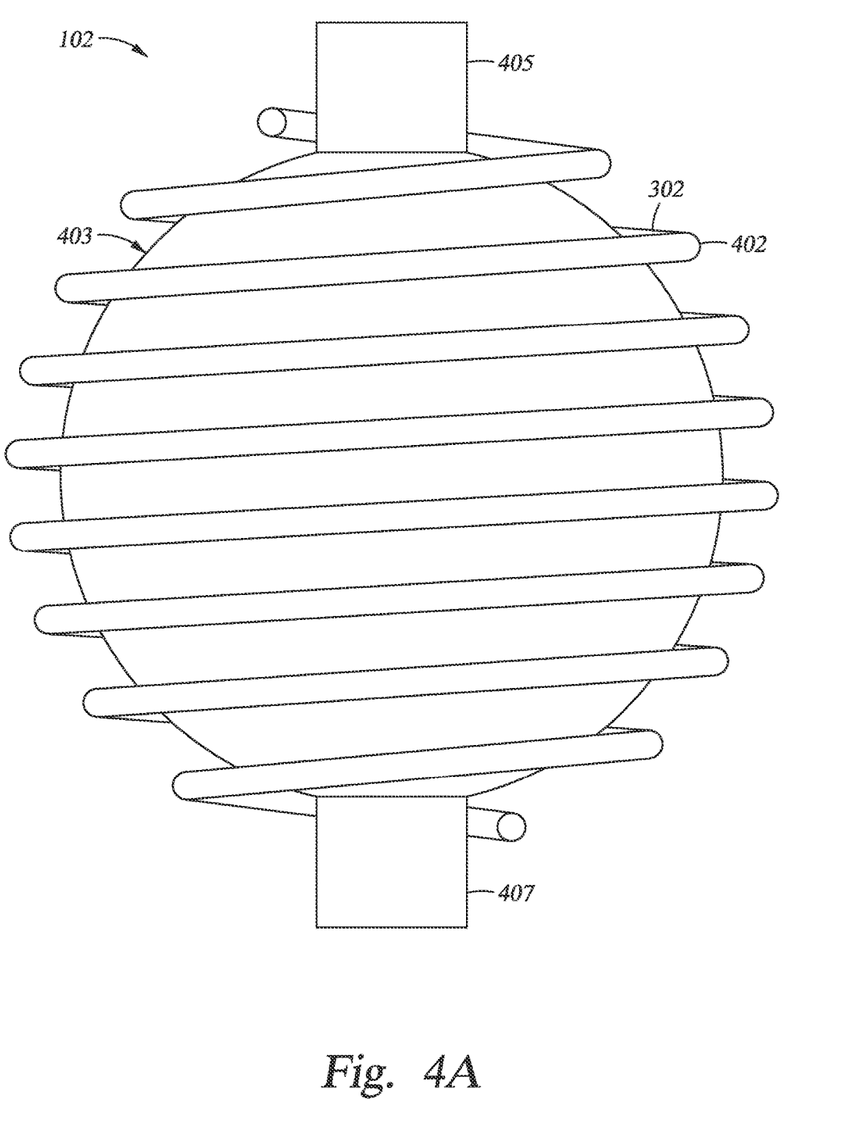
FIGS. 4A-4D schematically illustrate the plasma source.

FIGS. 4A-4D schematically illustrate various examples of the plasma source 102. FIG. 4A shows a side view of the plasma source 102 according to one example. The plasma source 102 includes a body 403 having an inlet 405 and an outlet 407. The body 403 may be spherical or have another geometric form, and made of the same material as the body 202 shown in FIG. 2. The plasma source 102 may have a one or more plasma generators 302 disposed outside the body 403 in a position operable to form a plasma inside the body 403. In one embodiment, the one or more plasma generators 302 is in the form of an RF coil 402 that surrounds the body 403 of the plasma source 102. The RF coil 402 may be energized to inductively couple power to the gases flowing within the body 403, making the plasma source 102 shown in FIGS. 4A-4D an inductively coupled plasma source. The plasma source 102 shown in FIGS. 4A-4D does not include the opening 218 shown in FIG. 2 since the plasma generator 302 is disposed outside the body 403. In one embodiment, the corrosive materials existing the vacuum processing chamber 106 flows into the body 403 via the inlet 405 and out of the body 403 via the outlet 407. The corrosive materials may corrode the body 403. In order to protect the body 403 of the plasma source 102 from the corrosive materials and to increase the service life of the plasma source 102, the interior surface of the body 403 may be coated with a coating material that is resistant to the corrosive materials. The coating material may be yttrium oxide, diamond-like carbon, or other suitable material. The coating material may be coated on the inside surface of the body 403 by any suitable method, such as chemical vapor deposition (CVD) or arc spraying.

Figure 4B:
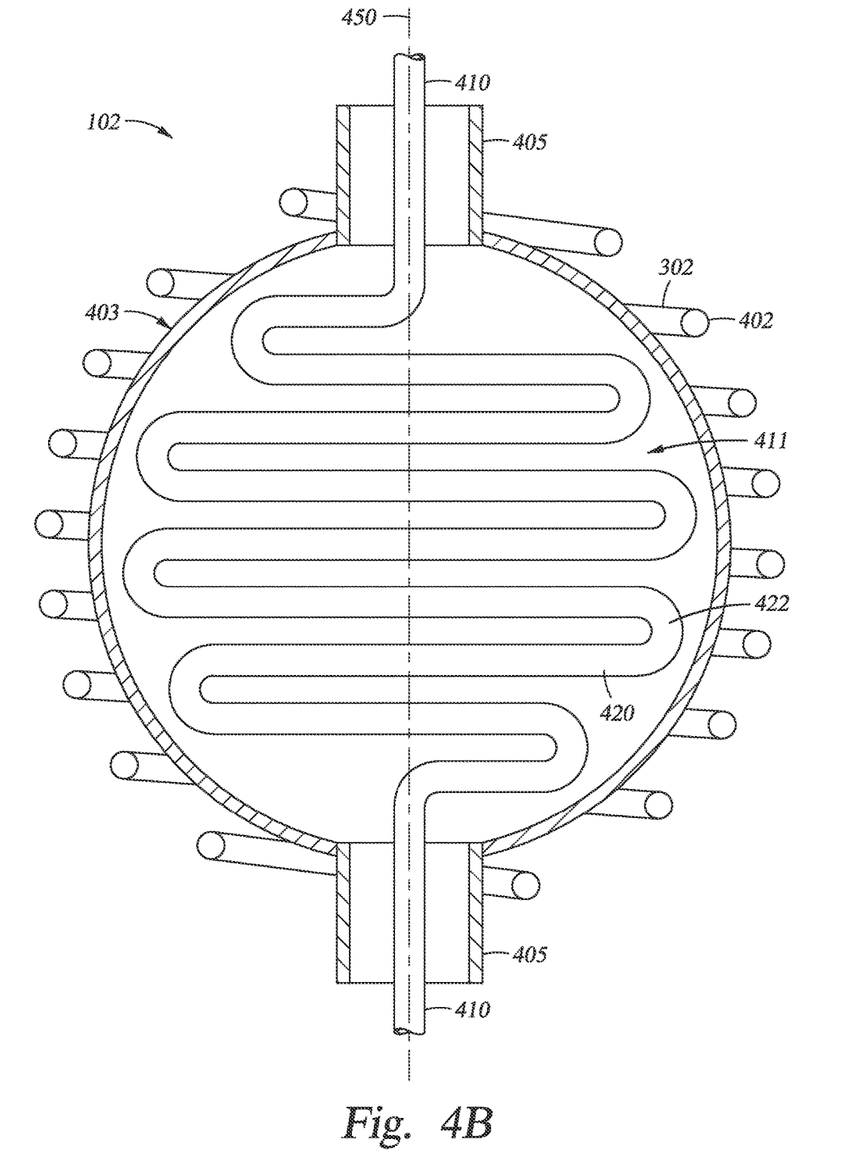
Figure 4C:
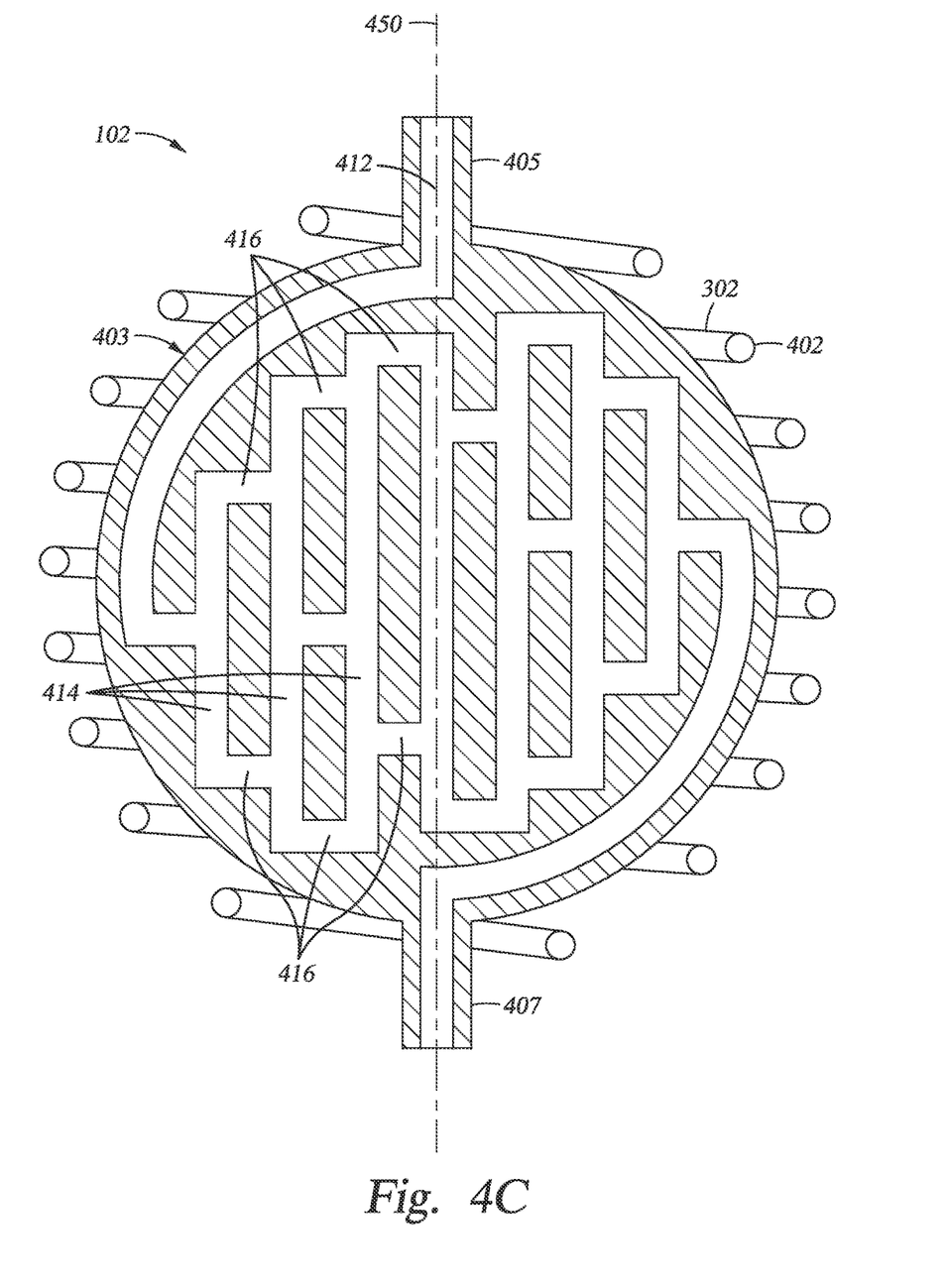
Figure 4D:
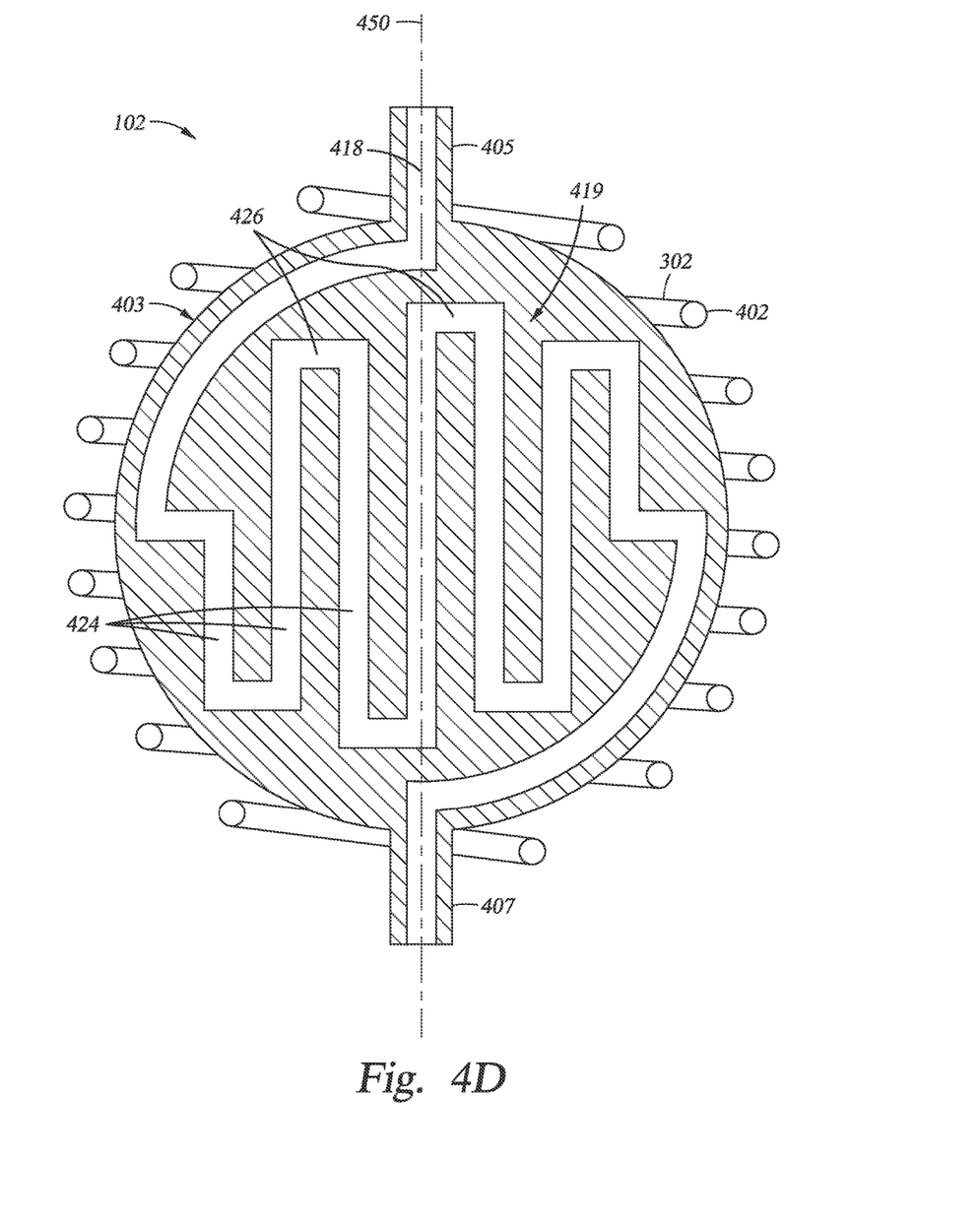

Alternatively, the corrosive materials existing the vacuum processing chamber 106 flows into a channel formed inside the body 403 via the inlet 405, and the inside surface of the channel may be coated with a coating material that is resistant to the corrosive materials. The coating material on the inside surface of the channel may be yttrium oxide, diamond-like carbon, AsMY (aluminum oxide silicon magnesium yttrium), an anodized material, ceramic liner, quartz tube, parylene or other suitable material. In some embodiments, the body 403 is a monolithic piece of material and the channel defined between the inlet 405 and the outlet 407 is formed in the monolithic body 403. In other embodiments, the body 403 is hollow and the hollow interior of the body 403 forms the channel defined between the inlet 405 and the outlet 407. One or more cooling channels may be formed in the space between the channel and the wall of the hollow body 403. FIGS. 4B-4D illustrate various examples of the channel inside the body 403 of the plasma source 102.

FIG. 4B is a cross-sectional view of the plasma source 102. The plasma source 102 includes the plasma generator 302 in the form of the RF coil 402, the body 403 and a channel 410 formed inside the body 403. The body 403 may be hollow, as shown in FIG. 4B, or a monolithic piece of material, as shown in FIGS. 4C and 4D. The channel 410 may extend from the inlet 405 to the outlet 407 and may have a tortuous portion 411 between the inlet 405 and the outlet 407, as shown in FIG. 4B. The tortuous portion 411 may include longitudinal portions 420 and bend portions 422. The longitudinal portions 420 may be substantially perpendicular to a central axis 450 that extends through the inlet 405 and the outlet 407. The inside surface of the channel 410 may be coated with a coating material that is resistant to the corrosive materials. The coating material on the inside surface of the channel may be yttrium oxide, diamond-like carbon, AsMY, an anodized material, ceramic liner, quartz tube, parylene or other suitable material.

FIG. 4C is a cross-sectional view of the plasma source 102. The plasma source 102 includes the plasma generator 302 in the form of the RF coil 402, the body 403 and a channel 412 formed inside the body 403. The channel 412 extends from the inlet 405 to the outlet 407. In one embodiment, the channel 412 includes a plurality of parallel passages 414 and at least two sub-channels 416 connecting adjacent passages 414. The passages 414 may be angled with respect to the RF coil 402, and the angle may be between 0 to 180 degrees, such as about 90 degrees. The passages 414 may be substantially parallel to the central axis 450, as shown in FIG. 4C, or substantially perpendicular to the central axis 450. The inside surface of the channel 412 may be coated with a coating material that is resistant to the corrosive materials. The coating material on the inside surface of the channel may be yttrium oxide, diamond-like carbon, AsMY, an anodized material, ceramic liner, quartz tube, parylene or other suitable material.

FIG. 4D is a cross-sectional view of the plasma source 102. The plasma source 102 includes the plasma generator 302 in the form of the RF coil 402, the body 403 and a channel 418 formed inside the body 403. The channel 418 may extend from the inlet 405 to the outlet 407 and may have a tortuous portion 419 between the inlet 405 and the outlet 407, as shown in FIG. 4D. The tortuous portion 419 may include longitudinal portions 424 and bend portions 426. The longitudinal portions 424 may be substantially parallel to the central axis 450. The inside surface of the channel 418 may be coated with a coating material that is resistant to the corrosive materials. The coating material on the inside surface of the channel may be yttrium oxide, diamond-like carbon, AsMY, an anodized material, ceramic liner, quartz tube, parylene or other suitable material.

The abatement system may include a foreline and a plasma source, and the inside surfaces of the foreline and the plasma source may be coated with a coating material, such as yttrium oxide or diamond-like carbon, in order to protect the foreline and the plasma source from corrosive materials that may enter into the foreline and the plasma source. Alternatively, a channel may be formed in a plasma source having a spherical hollow or monolithic body, and the inside surface of the channel may be coated with a coating material that is resistant to the corrosive materials. The coating material on the inside surface of the channel may be yttrium oxide, diamond-like carbon, AsMY, an anodized material, ceramic liner, quartz tube, parylene or other suitable material. Having coated inside surfaces, the service life of the abatement system is increased.

While the foregoing is directed to embodiments of the present disclosure, other and further embodiments may be devised without departing from the basic scope thereof, and the scope thereof is determined by the claims that follow.

The invention claimed is:
1. A plasma source, comprising:
    a body including an inlet and an outlet, wherein a central axis of the body extends through the inlet and the outlet;
    an RF coil surrounding the body; and
    a channel formed within the body and fluidly coupling the inlet and the outlet, wherein the channel comprises a tortuous portion, wherein an inside surface of the channel is coated with yttrium oxide, diamond-like carbon, or aluminum oxide silicon magnesium yttrium.
2. The plasma source of claim 1, wherein the body is spherical and is made of quartz or aluminum oxide.
3. The plasma source of claim 1, wherein the body is hollow.
4. The plasma source of claim 1, wherein the body is a monolithic piece of material.
5. The plasma source of claim 1, wherein the tortuous portion of the channel includes longitudinal portions and bend portions.

6. The plasma source of claim 5, wherein the longitudinal portions of the channel is substantially parallel to a central axis of the body.

7. The plasma source of claim 5, wherein the longitudinal portions of the channel is substantially perpendicular to a central axis of the body.

8. The plasma source of claim 1, wherein the channel comprises a plurality of parallel passages and at least two sub-channels connecting adjacent passages.

9. The plasma source of claim 8, wherein each of the plurality of parallel passages is substantially parallel to the central axis of the body.

10. The plasma source of 8, wherein each of the plurality of parallel passages is substantially perpendicular to the central axis of the body.

* * * * *